(12) United States Patent
Shiratori

(10) Patent No.: US 6,335,658 B1
(45) Date of Patent: Jan. 1, 2002

(54) DEMODULATION CIRCUIT

(75) Inventor: Akihiro Shiratori, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/442,269

(22) Filed: Nov. 17, 1999

(30) Foreign Application Priority Data

Nov. 18, 1998 (JP) .......................................... 10-327395

(51) Int. Cl.[7] .................................................. G06F 3/00
(52) U.S. Cl. ...................... 329/311; 359/135; 359/189; 455/214; 375/219; 375/340
(58) Field of Search ......................... 329/311; 359/135, 359/189; 455/214; 375/340, 219

(56) References Cited

U.S. PATENT DOCUMENTS

| 5,585,952 A | 12/1996 | Imai et al. .................. 359/135 |
| 5,745,005 A | 4/1998 | Natsumi ..................... 329/311 |

FOREIGN PATENT DOCUMENTS

| JP | 8-37548 | 2/1996 |
| JP | 9-36806 | 2/1997 |
| JP | 9-74384 | 3/1997 |
| JP | 9-135210 | 5/1997 |
| JP | 9-179669 | 7/1997 |

*Primary Examiner*—Arnold Kinkead
(74) *Attorney, Agent, or Firm*—Foley & Lardner

(57) ABSTRACT

A demodulation circuit can demodulate a serial data and an infrared data and can discriminate between the serial data and the infrared data. An edge detection circuit detects an edge of an infrared input and the edge signal and the serial data are taken by an OR circuit. An OR output and a total tap number signal are input to a LPF. The LPF has a function for outputting a demodulation output signal and the operation execution signal. By the operation execution signal, demodulation of the infrared input and demodulation of the serial input are discriminated by a data discrimination circuit. By this, an UART for reproducing the infrared data and the serial data is not required separately and can be made common.

10 Claims, 14 Drawing Sheets

DEMODULATION CIRCUIT

BACKGROUND OF THE INVENTION

1. Field of the Invention

The present invention relates generally to a demodulation circuit for infrared data. More particularly, the invention relates to a demodulation circuit which can reproduce infrared data and serial data.

2. Description of the Related Art

According to the development of electronic industries in the recent years, data communication between a plurality of electronic equipments has been spreading as a normal technology. Particularly, in case of a portable terminal or notebook PC (personal computer), for which portability is given importance, reduction of weight has been attempted by eliminating an external storage medium, such as a floppy disk drive, an external magnetic disk driven or so forth. Therefore, the function for communicating with other equipments has been the essential function for such type of equipments, such as portable terminal, notebook PC or so forth. Currently, in addition to a serial communication port typically represented by that according to the RS232C standard, an infrared communication port which does not require cable connection, has been equipped as standard component.

As a standard for infrared communication, IrDA (Infrared Data Association) has been standardized. However, this IrDA standard is adapted for opposing communication in one to one basis to encounter a problem in low freedom in the sense of convenience of use. This problem has been resolved by infrared standard called IrBUS established on Jan., 1998. In the portable terminal or notebook PC equipped with the IrBUS, it becomes necessary to effectively realize hardware which also have communication functions in the conventional serial port.

On the other hand, conversion from an infrared ray into an electric signal has been realized by an analog circuit, and has been commercialized by semiconductor manufacturers as infrared modules. Since no standard has been established for the infrared module per se, interfaces with the electrical signal are different in respective companies. For example, in IRDA or IrBUS, an infrared ray in which data is modulated with a given carrier frequency, has been used. The electrical signal output from the infrared modules is reproduced as a digital signal with modulated carrier frequency or as a serial signal from which the carrier frequency is removed. These reproduction signal are different in transfer rate of data to inherently require serial/parallel conversion circuit dedicated thereto upon outputting data with serial/parallel conversion to a bus. Such serial/parallel conversion circuit is referred to as Universal Asynchronous Receiver/Transmitter (UART) to perform sampling of input sampling data at a sampling rate corresponding to a data rate, then to perform serial/parallel conversion and thus to output the data to the bus at the predetermined timing. Therefore, the demodulation circuit of the electric signal requires dedicated circuit specified therefore to inherently cause increasing of the scale of the circuit.

The Circuit construction in the prior art is illustrated in FIG. 14. In FIG. 14, an infrared input 1 receives a signal output from an infrared module receiving an infrared signal according to IrDA standard, for example. A serial input 2 receives a signal (i.e. serial data) output from a serial port, such as RS-232C or so forth or the infrared module receiving the infrared signal according to IrBUS standard. The infrared input 1 is connected to a system bus 6 via an UART 5B after demodulation by a demodulation circuit 4. The serial input 2 is connected to the system bus 6 only via the UART 5A. Here, the demodulation circuit 4 is designed for converting (i.e. demodulating) the infrared signal into the serial data. As can be clear from FIG. 14, when the demodulation circuit 4 receives the serial signal through the serial input 2 and the UART 5B can provide an output, the UART 5A can be eliminated. However, since the infrared input and the serial input have mutually different communication protocol, correct serial/parallel conversion cannot be performed in the UART 5B, and the UART 5B thus cannot output the correct data to the bus unless the signal output from the demodulation circuit can be identified as either the serial data or the infrared data. Namely, unless the signal output from the demodulation circuit can be identified as either the serial data or the infrared data, control by the communication software becomes impossible. Therefore, the UART 5A and 5B respective have dedicated design adapting to respective communication protocol and the user has to manually perform system setting of the protocol of the reception data preliminarily upon reception. The system performs selection of the UART on the basis of the setting and performs control of the communication software.

As a typical demodulation technology of the infrared input, there is a method to perform demodulation of the infrared input by a low pass filtering (LPF) process by means of a Finite Impulse Response (FIR) type digital filter. This method sets a pass-band by a filter coefficient of the digital LPF to reproduce an objective signal. A tap coefficient of the filter and a result of superimposing are processed by respective one bit. Operation timing is shown in FIG. 15. In FIG. 15, an impulse response corresponding to a pulse P1 input from the infrared input terminal 1 is executed by the LPF 9 to obtain a pulse response A. In the similar manner, a pulse response B corresponding to a pulse P2 input from the infrared input terminal 1 and a pulse response C corresponding to a pulse P3 can be obtained. Then, result of superimposing of the pulse responses A to C is reproduced as a demodulated output.

In such method, while it is possible to input the serial data from the infrared input terminal, it is not possible to distinguish whether the infrared data or the serial data is received, from the demodulated output. As shown in FIG. 14, the demodulated output is supplied to the superior information processing system, such as a CPU (not shown) or so forth via a system bus 6 and then data processing is performed.

For example, which both of the infrared data and the serial data are subject to serial-to-parallel (S/P) conversion process, sampling frequencies required for the S/P conversion process are different in both data. Therefore, it becomes necessary to distinguish whether the input signal is the infrared data or the serial data. On the other hand, in case of the infrared data, since error correction, CRC operation or so forth becomes necessary, discrimination of the input signal between the infrared data or the serial data becomes necessary even in this process. Therefore, upon practical use, it becomes necessary to fix whether the infrared data or the serial data is to be used. However, in the foregoing example, since automatic discrimination between the infrared data and the serial data cannot be performed, automatic switching by software cannot take place.

Here, as an example of another conventional demodulation circuit, a circuit construction is shown in FIG. 16, and operational timing is shown in FIG. 17. In this circuit, a method to preliminarily set a photo receiving range of the infrared input and to eliminate the input out of the photo receiving range from a result of the count of the pulse width of the input infrared ray, is employed. In FIG. 16, the infrared input is input to the LPF 9 and the pulse width counting portion 21, and the pulse width of the reception data is counted with a high speed clock. A result of counting of the pulse width is checked as to whether it falls within a predetermined value or not, by a photo reception error judgment portion 22 to perform reproduction of data.

In the timing chart shown in FIG. 17, during a period where the infrared input is "H", counting of the pulse is performed. Then, if a result of counting of the pulse width falls within the photo receiving range, the data is judged as normal, and otherwise output as photo reception error.

In this technology, when the serial data is input to the infrared input, it can be judged as a photo reception error and thus cannot be demodulated correctly. On the other hand, in order to eliminate noise by setting the photo reception range, a photo receiving element having high response characteristics becomes necessary in the infrared input portion. Since an external noise is independently input and has no continuity, discrimination by the demodulated output is possible.

As further prior art, a circuit shown in Japanese Unexamined Patent Publication No. 9-179669 is illustrated in FIG. 18. In the shown prior art, a system is constructed with a CPU 112 performing data processing, an I/O controller 113 performing signal conversion in order to establish connection between the CPU 112 and the external equipment, an interface selection circuit 114 determining an interface to be used according to instruction from the CPU 112 connected to the I/O controller 113, an IR driver illuminating an infrared ray depending upon a transmission signal output from the I/O controller 113, and a system reset circuit 116 generating a reset signal for resetting a system by detecting on-set of power supply by generating a reset signal and supplying the same to the CPU 112.

The I/O controller 113 is constructed with a CPU interface circuit portion 113a establishing connection with the CPU 112, an IR interface circuit portion 113b for generating a transmission signal for driving the IR driver 115, a serial interface circuit portion 113c for generating the transmission signal for driving the serial driver, a switch for selecting either the IR interface circuit portion 113b or the serial interface circuit portion 113c, and a switch selection circuit portion 113e for controlling the switch. The interface selection circuit 114 generates a selection signal Tc for selecting either of the IR interface circuit portion 113b or the serial interface circuit 113c depending upon a selection command supplied from the CPU 112 to supply to the I/O controller 113.

The shown technology is adapted to permit external control for selecting either the infrared data or the serial data upon reception of the infrared data and the serial data, and does not permit discrimination between the serial data and the infrared data from the received data.

A first problem to be encountered in the prior art set forth above is absence of effective means which can demodulate both of the infrared data input and the serial data input and can discriminate which of the infrared data or the serial data is input. A second problem is to cause the requirement of two UART in the system for the reason that the first problem cannot be solved, which causes increasing of the circuit scale and power consumption. A third problem is that a device having high response characteristics becomes necessary in the infrared ray receiving portion. In this respect, the photo reception element to be employed has to have a photo receiving characteristics falling within a frequency range of photo receiving, and a difference of delay period due to transition response falls within a given value.

SUMMARY OF THE INVENTION

It is therefore an object of the present invention to provide a demodulation circuit which can input and output both of a serial data and an infrared data and can discriminate a received data between the serial data and the infrared data.

According to an aspect of the present invention, a demodulation circuit for inclusively receiving an infrared data and a serial data and outputting a decoded signal, comprises:

edge detecting means for detecting an edge of the infrared data and outputting an edge detection signal;

AND means for deriving AND of the edge detection signal and the serial data;

low-pass filter means for initiating a filter operation in response to an output of the AND means and outputting an operation execution signal indicative of a filter operation period preliminarily determined by a total tap number signal of a preliminarily input digital filter and a demodulation signal as a filter process output; and data discrimination means for discriminating between demodulation of the infrared data and demodulation of the serial data depending upon the operation execution signal and outputting a result of discrimination.

The operation execution signal may be a pulse from completion of inputting of an input signal of the low-pass filter to completion of the filter operation. On the other hand, the data discrimination means may compare number of times of tap calculation of a filter executed during a predetermined period from initiation of outputting of a demodulated signal from the low-pass filter and a preliminarily set number of times to output the result of discrimination depending upon a result of comparison.

In the preferred construction, the low-pass filter means may comprises:

a first m-bit selection circuit taking a first fixed value as one input and controlled by the output signal of the AND means, wherein m is an integer greater than or equal to two;

an m-bit flip-flop taking an output of the first m-bit selection means as input;

a first comparator circuit for comparing an output of the m-bit flip-flop and a second fixed value;

an m-bit adder circuit adding an output of the first comparator circuit to a least significant bit of data output of the m-bit flip-flop;

a second comparator circuit comparing the data output of the m-bit flip-flop and a total tap number of the filter;

a second m-bit selection means taking an output of the m-bit adder and a third fixed value as inputs, controlled by an output of the second comparator circuit and outputting to the other input of the first m-bit selection circuit; and third comparator circuit comparing the output of the m-bit flip-flop and an arbitrary fixed value, output signal of the first comparator circuit being output as the operation execution signal, the output signal of the first comparator circuit being output from a demodulation output terminal.

In the alternative, the low-pass filter means may comprise:

a first m-bit selection circuit taking a first fixed value as one input and controlled by the output signal of the AND means, wherein m is an integer greater than or equal to two;

an m-bit flip-flop taking an output of the first m-bit selection means as data input;

a first comparator circuit for comparing a data output of the m-bit flip-flop and a second fixed value;

an m-bit adder circuit adding an output of the first comparator circuit to a least significant bit of data output of the m-bit flip-flop;

a second comparator circuit comparing the data output of the m-bit flip-flop and a total tap number of the filter;

a second m-bit selection means taking an output of the m-bit adder and a third fixed value as inputs, controlled by an output of the second comparator circuit and outputting to the other input of the first m-bit selection circuit; and an AND circuit deriving an AND of the output of the second comparator circuit and an inverted output of the OR means, the output signal of the AND circuit being output as the operation execution signal and the output signal of the first comparator circuit being output through a demodulation output terminal.

In the further alternative, the low-pass filer may comprise:

an m-bit selection circuit having three inputs and taking first and second fixed values as inputs;

an m-bit flip-flop taking an output of the m-bit selection means as data input;

a first comparator circuit for comparing a data output of the m-bit flip-flop and a third fixed value;

an m-bit adder circuit adding an output of the first comparator circuit to a least significant bit of data output of the m-bit flip-flop;

a second comparator circuit comparing the data output of the m-bit flip-flop and a total tap number of the filter; and a third comparator circuit taking the output of the m-bit flip-flop and the arbitrary fixed value as inputs, the m-bit selection circuit being controlled by the output of the OR means and the output of the second comparator circuit to output the output signal of the third comparator circuit as the operation execution signal, and the output of the first comparator circuit being output from a demodulation output terminal.

In the still further alternative, the low-pass filer may comprise:

a third m-bit selection circuit having three inputs and taking first and second fixed values as inputs;

an m-bit flip-flop taking an output of the third m-bit selection means as data input;

a first comparator circuit for comparing a data output of the m-bit flip-flop and a third fixed value;

an m-bit adder circuit adding an output of the first comparator circuit to a least significant bit of data output of the m-bit flip-flop;

a second comparator circuit comparing the data output of the m-bit flip-flop and a total tap number of the filter;

a third comparator circuit taking the output of the m-bit flip-flop and the arbitrary fixed value as inputs, and an AND circuit deriving an AND of the output of the second comparator circuit and an inverted output of the OR means, the m-bit selection circuit being controlled by the output of the OR means and the output of the second comparator circuit, the output of the AND circuit being output as the operation execution signal, and the output signal of the first comparator circuit being output through a demodulation output terminal.

Then, the least significant bit of the first fixed value may be set "1", all bits of the first fixed value other than the least significant bit are set "0", all bits of the second and third fixed values may be set "0", and the arbitrary fixed value may be set greater than or equal to "2", and the m may be set at a value derived by rounding a logarithm of 2 of total tap number into an integer.

Also, the data discrimination means may have an AND circuit taking the operation execution signal and a reference timing signal externally input at a preliminarily set reference timing, and an output signal of the AND circuit is output as the discrimination result signal. The data discrimination means may also be supplied a reference timing signal externally input at a preliminarily set reference timing to a holding terminal and is supplied the operation execution signal to an enabling terminal, and may have a counter for counting a predetermined clock signal, for outputting an output signal of the counter as the discrimination result signal.

In the operation of the present invention, the edge detection circuit detects the edge of an infrared input and the OR of the edge signal and the serial data is taken by the OR circuit. The OR output and a total tap number signal are input to the LPF. The LPF has a function for outputting the demodulation output signal and the operation execution signal. By the operation execution signal, demodulation of the infrared input and demodulation of the serial input are discriminated by the data discrimination circuit. By this, the UART for reproducing the infrared data and the serial data is not required separately and can be made common.

BRIEF DESCRIPTION OF DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 3:
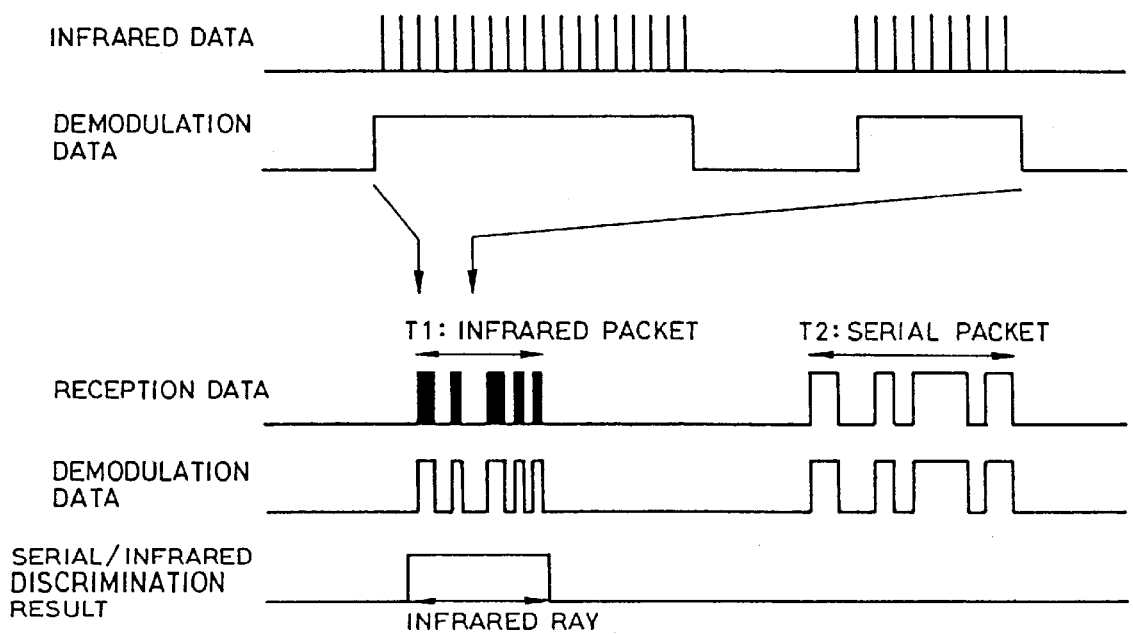
FIG. 3 is a timing chart showing general operation of the demodulation circuit of the present invention as illustrated in FIG. 2.

First of all, the general operation of the present invention will be discussed with reference to FIG. 3. In FIG. 3, as an infrared input, a signal, in which a given carrier frequency (e.g. 1.5 MHz) is modulated by an infrared data, is input. The modulated infrared data is reproduced as a demodulated data by a demodulation circuit according to the present invention. On the other hand, a reception data input to the demodulation circuit includes an infrared packet input during a period of T1 shown in FIG. 3 and a serial packet input (a frequency of the serial data is about 100 KHz, for example) during a period of T2 in admixed fashion (input exclusively with each other in time). It is a function of the present invention to reproduce these admixed data as the demodulated data and to provide external notification as a result of serial/infrared discrimination.

Figure 1:
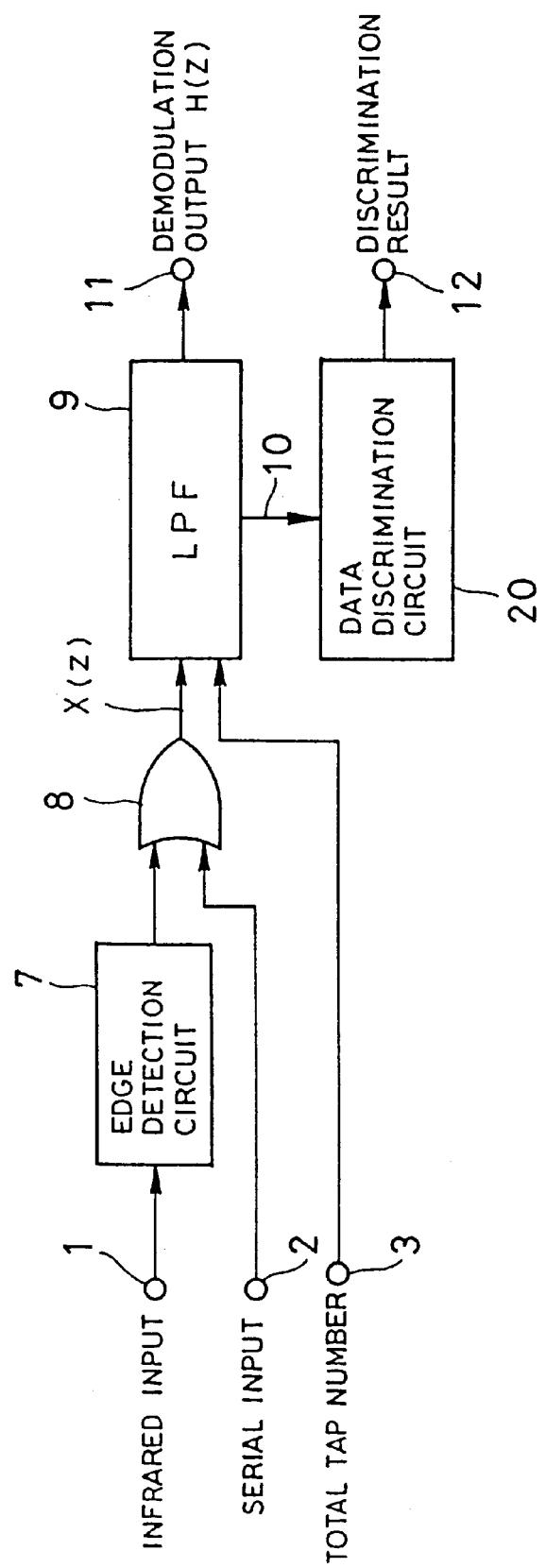
FIG. 1 is a block diagram showing the preferred embodiment of a demodulation circuit according to the present invention.

FIG. 1 is a circuit diagram showing the preferred embodiment of a demodulation circuit according to the present invention. Namely, the preferred embodiment of the demodulation circuit includes an infrared input terminal 1, a serial input terminal 2, a total tap number input terminal 3 for inputting a total tap number of a digital filter, an edge detection circuit 7 inputting a signal from the infrared input terminal 1, an OR circuit 8 inputting an output of the edge detection circuit 7 and an input from the serial input terminal 2, a LPF 9 taking an output signal of the OR circuit 8 and a total tap number set by the total tap number input terminal 3, a data discrimination circuit 20 taking an operation execution signal 10 from the LPF 9 as an input and outputting a result of judgment either for the infrared signal or the serial signal to be demodulated, a demodulation output terminal 11 outputting a result of demodulation from the LPF 9 and a judgment result output terminal 12 outputting a result of judgment from the data discrimination circuit 20.

In FIG. 1, the infrared data input from the infrared input terminal 1 is converted into a given pulse width in synchronism with the rising timing by an edge detection circuit 7.

The infrared data contains a transition response characteristics of the photo receiving device, or jitter due to a frequency difference between a transmission side and a reception side. In the present invention, in order to suppress the influence of jitter an edge of the infrared data is detected to maintain the pulse width as the detected infrared data at constant value. By this, a tap operation period necessary for demodulating one infrared data can be maintained constant.

The pulse width is set at a minimum value which can be processed by the LPF 9. Particularly, the pulse width corresponds to one clock at a sampling clock (e.g. 3 to 6 MHz) as an operation clock of the LPF 9. On the other hand, an OR of the serial data input from the serial input terminal 2 and the infrared data detected the edge is obtained by the OR circuit 8 and input to an input X(Z) of the LPF 9. The total tap number of the LPF 9 is set by the total tap number input terminal 3. The LPF outputs the operation execution signal 10 indicative of a tap calculation period in addition to the demodulated output H(Z) as the filter. By counting the operation execution signal 10 upon detection of "H"of the demodulation output in the LPF 9, it can be discriminated whether the demodulated out is generated by reproducing the modulated infrared data or by reproducing the serial data.

Figure 4:
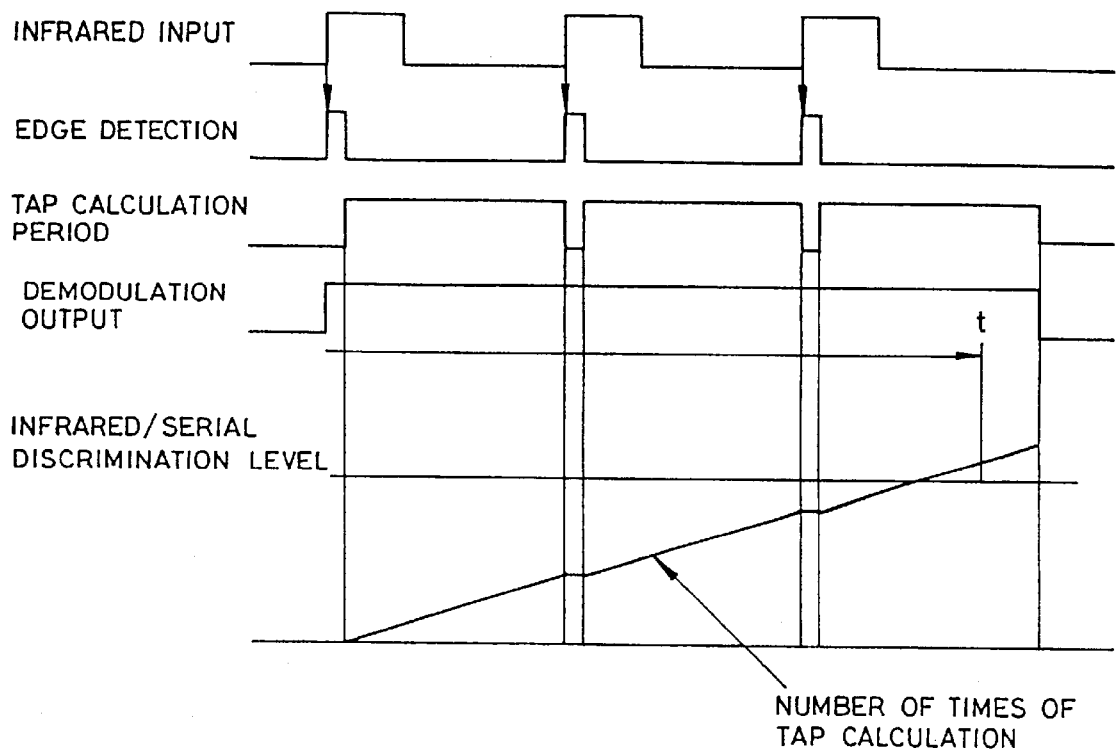
FIG. 4 is a timing chart showing one example of operation of the demodulation circuit of FIG. 2.

In FIG. 4, there is shown a timing chart showing an operation from inputting of the infrared data to judgment of infrared data or serial data. In FIG. 4, the rising edge of the pulse from the infrared input is converted into a pulse train represented by edge detection. In the LPF 9, during a period where a signal of edge detection shown in the tap calculation period is held "L(low) level", tap calculation is executed to output the demodulation signal indicative of the demodulation output.

Discrimination between the infrared data and the serial data is performed depending upon number of timings of execution of tap calculation counted by the data discrimination circuit during a period t second as counted from the rising transition of the demodulation output indicative of leading end of the received infrared packet. A discrimination period t in FIG. 4 is set to a period corresponding to three infrared data. When the number of times of tap calculation up to a timing t exceeds an infrared/serial discrimination level, the reception data is judged as the infrared data. By employing a counter for counting the number of times of tap calculation as the data discrimination circuit 20 in the embodiment shown in FIG. 1, discrimination at the timing t shown in FIG. 4 becomes possible.

Figure 5:
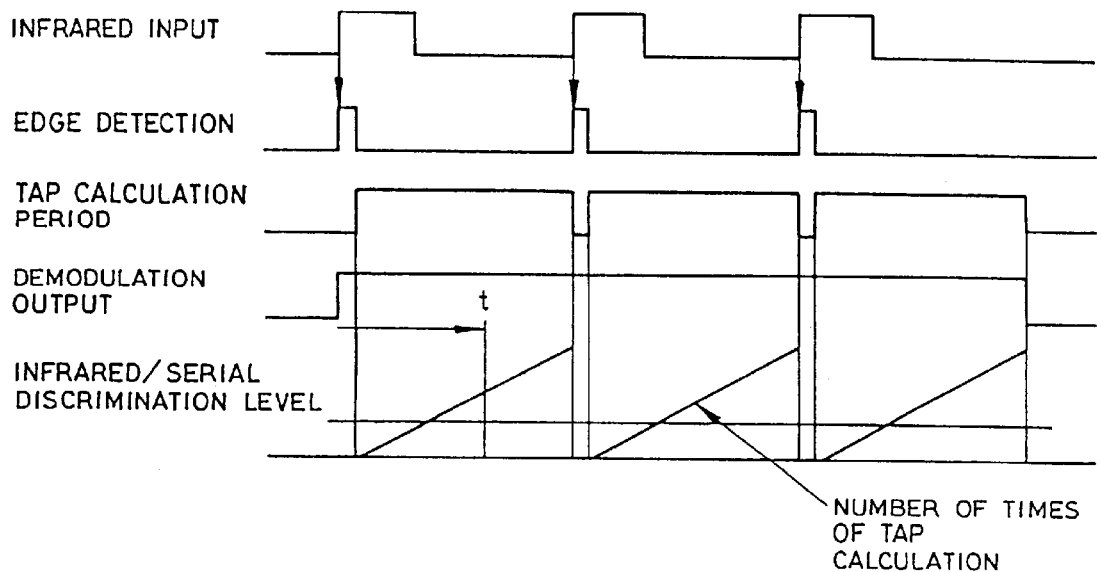
FIG. 5 is a timing chart showing another example of operation of the demodulation circuit of FIG. 2.

In the timing chart shown in FIG. 5, there is shown an example of operation in the case where a period t from inputting of the infrared data to making the discrimination between the infrared data and the serial data is set at a period corresponding to about one pulse of the infrared data. In FIG. 5, an infrared input, edge detection, number of times of tap calculation and demodulation output become the same operation as the timing chart shown in FIG. 4, respectively. As the data discrimination circuit 20 in the preferred embodiment shown in FIG. 1, discrimination at a timing t shown in the timing of FIG. 5, can be performed by employing a comparator circuit comparing the number of times of tap calculation and the infrared/serial discrimination level.

Figure 6:
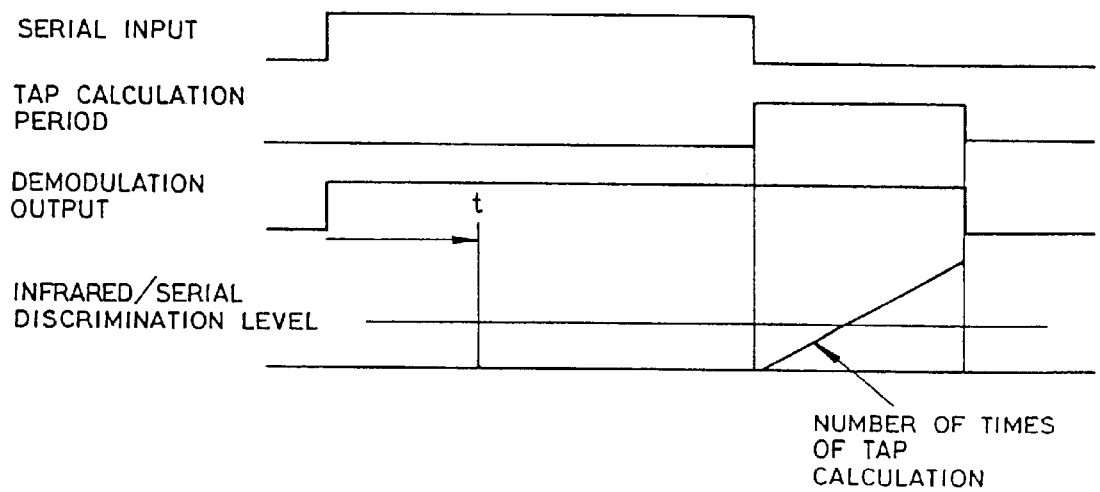
FIG. 6 is a timing chart showing a further example of operation of the demodulation circuit of FIG. 2.

In FIG. 1, the serial data input through the serial input terminal is input to the LPF 9 via the OR circuit 8. In the LPF 9, tap calculation is not executed during a period while the serial data is input. FIG. 6 is a timing chart showing operation when the serial data is input through the serial input terminal 1. In FIG. 6, during a period where the serial data is "H", tap calculation is not executed. The number of times of execution during a period of t seconds from variation of the demodulation output into "H (high)" is "0 times". The tap calculation is not executed despite of the fact that "H" is output from the demodulation output. Therefore, it becomes possible to make a judgment that serial data is received.

Next, construction of the LPF 9 will be discussed. As the LPF 9, one-bit FIR digital filter construction may be employed in general. However, in the case of an n-tap construction of the FIR digital filter, (n–1) delays (flip-flops) are connected in cascade to operate these delays at a sampling clock, and to sum respective delay output of these tap to obtain summing output as a filter output. However, in such construction, circuit elements are inherently increased according to increasing of value (n). Therefore, this approach would not be advantageous from the viewpoint of package density and cost. In the shown example, in place of the FIR digital filter, a filter having a construction shown in FIG. 7 is used as the one bit LPF having the function equivalent to the FIR filter.

Figure 7:
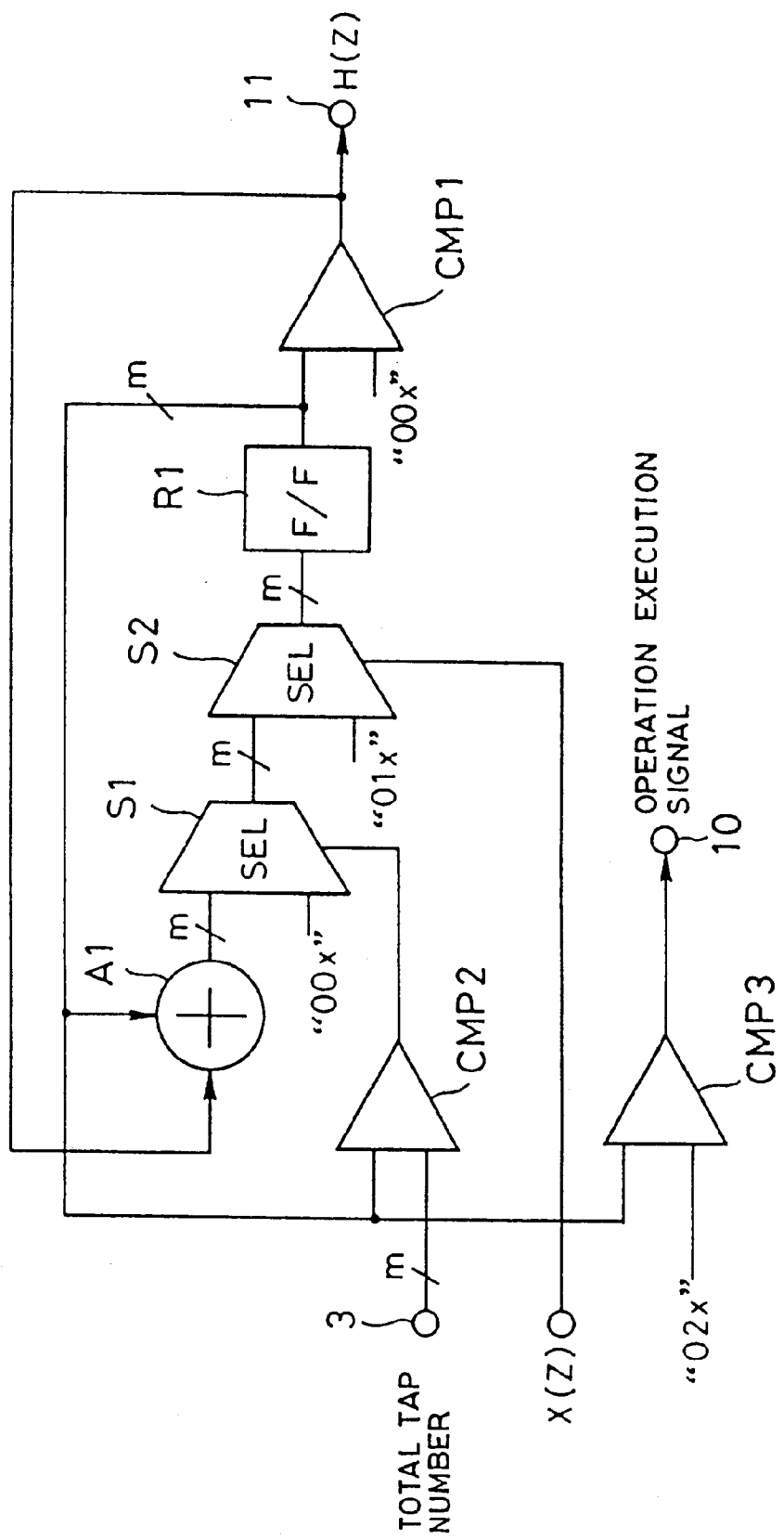
FIG. 7 is a circuit diagram showing one example of a low-pass filter (LPF)

Namely, the filter shown in FIG. 7 includes an m-bit selection circuit S2 taking an output of an m-bit selection circuit S1 and a first fixed value as inputs and being controlled by a data input X(Z), a m-bit latching flip-flop (F/F) R1 taking an output of the m-bit selection circuit S2 as data input, a first comparator circuit CMP1 comparing a data output of the m-bit latching F/F R1 and a second fixed value, an m-bit adder circuit A1 for adding an output of the first comparator circuit CMP1 to the least significant bit of the data output of the m-bit latching F/F R1, a second comparator circuit CMP2 comparing the data output of the m-bit latching F/F R1 and an input value input through a total filter tap number input terminal, an m-bit selection circuit S1 taking an output of the m-bit adder circuit A1 and a third fixed value as inputs and being controlled by the output of the second comparator circuit CMP2, a demodulation output terminal 11 connected to an output of the first comparator circuit CMP 1, a third comparator circuit CMP3 taking the output of the m-bit latching F/F R1 and a predetermined fixed value, and an operation execution signal output terminal 10 connected to an output of the third comparator circuit CMP3.

In FIG. 7, assuming that a bit number of the total tap number input terminal 3 is "m" bits, a maximum 2m total tap number can be set. On the other hand, the least significant bit of the first fixed value is set at "H", all bits of the first fixed value except for the least significant bit are set at "L", all bits of the second and third fixed values are set "L, an arbitrary fixed value is set greater than or equal to "2", and the foregoing constant m is set at a value derived by rounding a logarithm of 2 as the total tap number into an integer, respectively.

Figure 8:
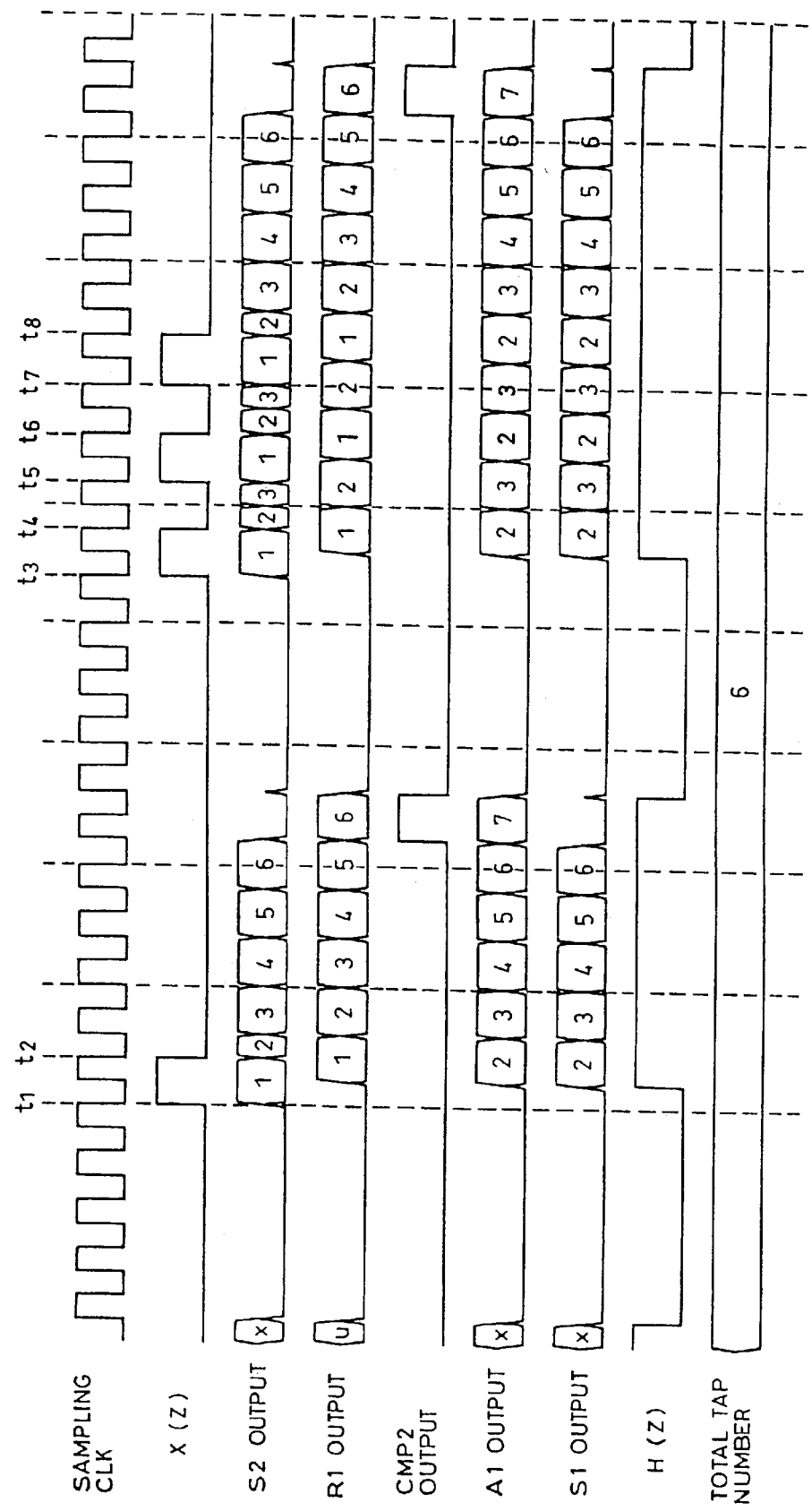
FIG. 8 is a timing chart showing operations in respective part of the LPF of FIG. 7.

FIG. 8 is an example of timing charts showing operations of respective parts in the LPF and shows the case where the total tap number is "6". In the condition where the input X(Z) as data input is "H" level, "H" is output from the least significant bit of the m-bit selection circuit S2, and "L" are output from all bits of the m-bit selection circuit S2 except for the least significant bit. This value is input to the first comparator circuit CMP1 via the m-bit latching F/F R1.

In the first comparator circuit CMP1, "L" is output when a number to compare and a number to be compared are equal to each other. The other input of the first comparator CMP1 is the fixed value set at "L". Since the least significant bit is not "H", "H" is output from the first comparator circuit CMP1. The "H" output from the first comparator circuit CMP1 is output from the output terminal 11, and in conjunction therewith, is added to the least significant bit of the m-bit adder circuit A1. In the m-bit adder circuit A1, a current output value from the m-bit latching F/F R1 is set to "+1".

Next, when the input X(Z) is varied into L level, a result of addition in the m-bit adder circuit A1 is output from the output of the m-bit selection circuit S2 through the m-bit selection circuit S1, and is stored in the m-bit latching F/F R1. The output from the m-bit latching F/F R1 is updated to a value incremented by "+1" from the value stored precedingly. Similarly, the output of the m-bit latching F/F R1 is updated to values incremented by "+1" at every occurrence of rising of the clock. This value corresponds to a current tap position as LPF corresponding to the most recent data input X(z).

The second comparator circuit CMP2 compares the current output of the m-bit latching F/F R1 and the set value by the total tap number input terminal 3. When the value of the m-bit latching F/F R1 becomes equal to the total tap number, all of the outputs of the m-bit selection circuit S1 are set to "L". If the value of the m-bit latching F/F R1 is less than the set value as the total tap number, control is performed for selecting the output of the m-bit adder circuit A1 as the output from the m-bit selection circuit S1. When the counted value of the m-bit latching F/F R1 becomes equal to the total tap number, "L" is output at all of outputs of the m-bit selection circuit S1 under control of the second comparator circuit CMP2. Thus, "L" is set for all of inputs of the first comparator circuit CMP1 via the m-bit selection circuit S2 and the m-bit latching F/F R1.

Thus, the first comparator circuit CMP1 outputs "L" pull down H(Z) as the filter output 11 from "H" to "L". In conjunction therewith, addition of "+1" in the m-bit adder circuit A1 is stopped. By this, all of the output value from the m-bit latching F/F R1 becomes "L", and is held at "L" until "H" is input from the data input terminal 1. As the output obtained from the output terminal 11, a result of LPF process of the input X(Z) is output.

The value output from the m-bit latching F/F R1 takes a value within a range between "0" to the set value of the total tap number input terminal 3. Since the value greater than or equal to "2" of the m-bit latching F/F R1 corresponds to the tap calculation execution period, the signal indicative of the tap calculation period can be obtained from the operation execution signal 10 by performing comparison of the output of the m-bit latching F/F R1 and the predetermined fixed value ("2" in the shown example) which is greater than or equal to "2". As a result, "H" of the operation execution signal 10 is output during the tap calculation execution period, and "L" is output in other period.

Figure 9:
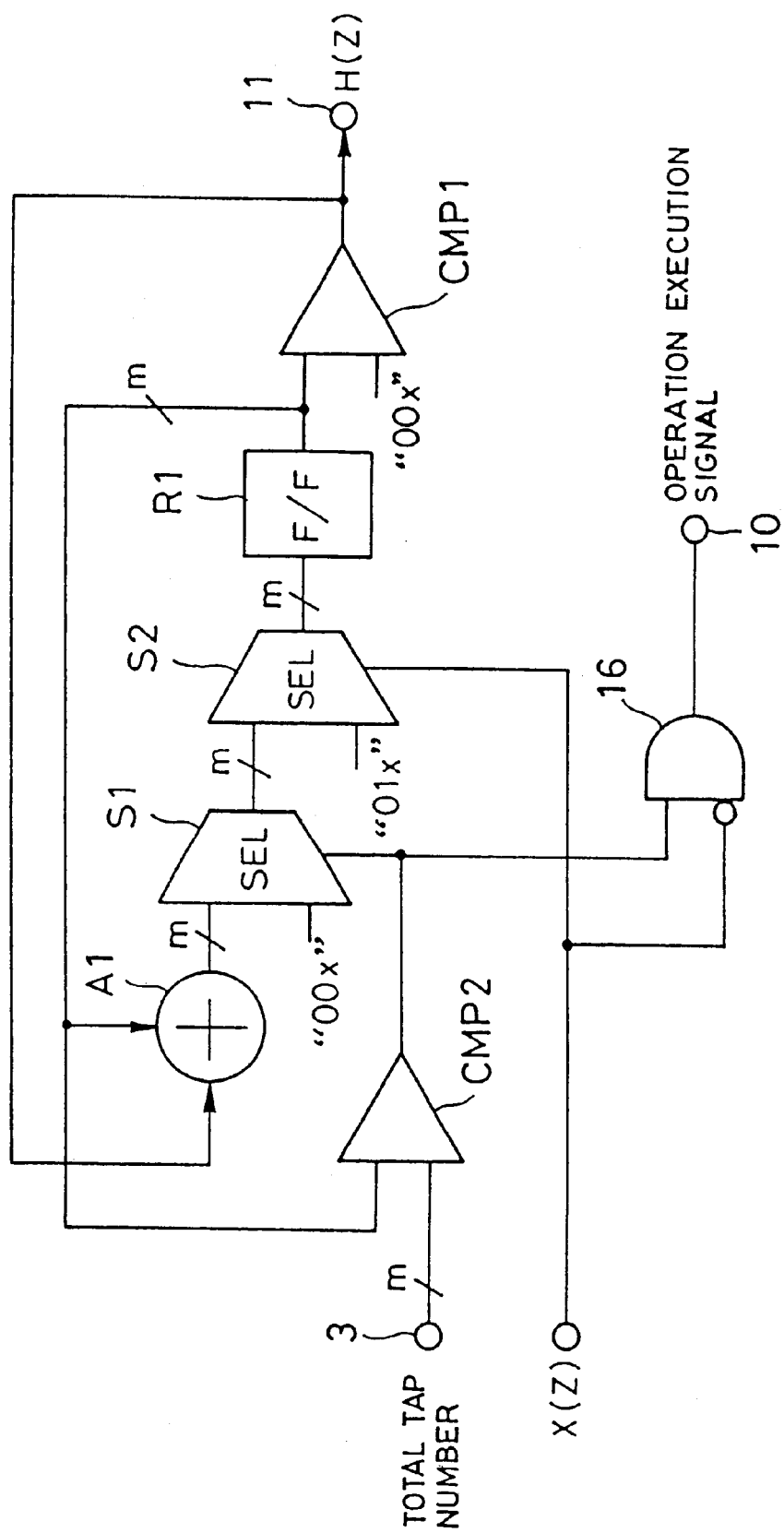
FIG. 9 is a circuit diagram showing a further example of the LPF.

FIG. 9 is a circuit diagram showing the second embodiment of the LPF 9. Like elements to those in FIG. 7 will be identified by like reference numerals. In the shown embodiment, portions different from the construction shown in FIG. 7 is a circuit portion leading the execution signal 10. In place of the third comparator circuit CMP3 of FIG. 7, a two-input AND circuit 16 is employed. Namely, to one input, an inverted signal of the input signal X(Z) is supplied. To the other input, the output of the second comparator circuit CMP 2 is supplied. Then, the output of the AND circuit 16 serves as the operation execution signal 10. Other constructions are the same as those in the embodiment shown in FIG. 7, and thus detailed discussion for such common elements would be neglected for avoiding redundant discussion and whereby for keeping the disclosure simple enough to facilitate clear understanding of the present invention.

Figure 10:
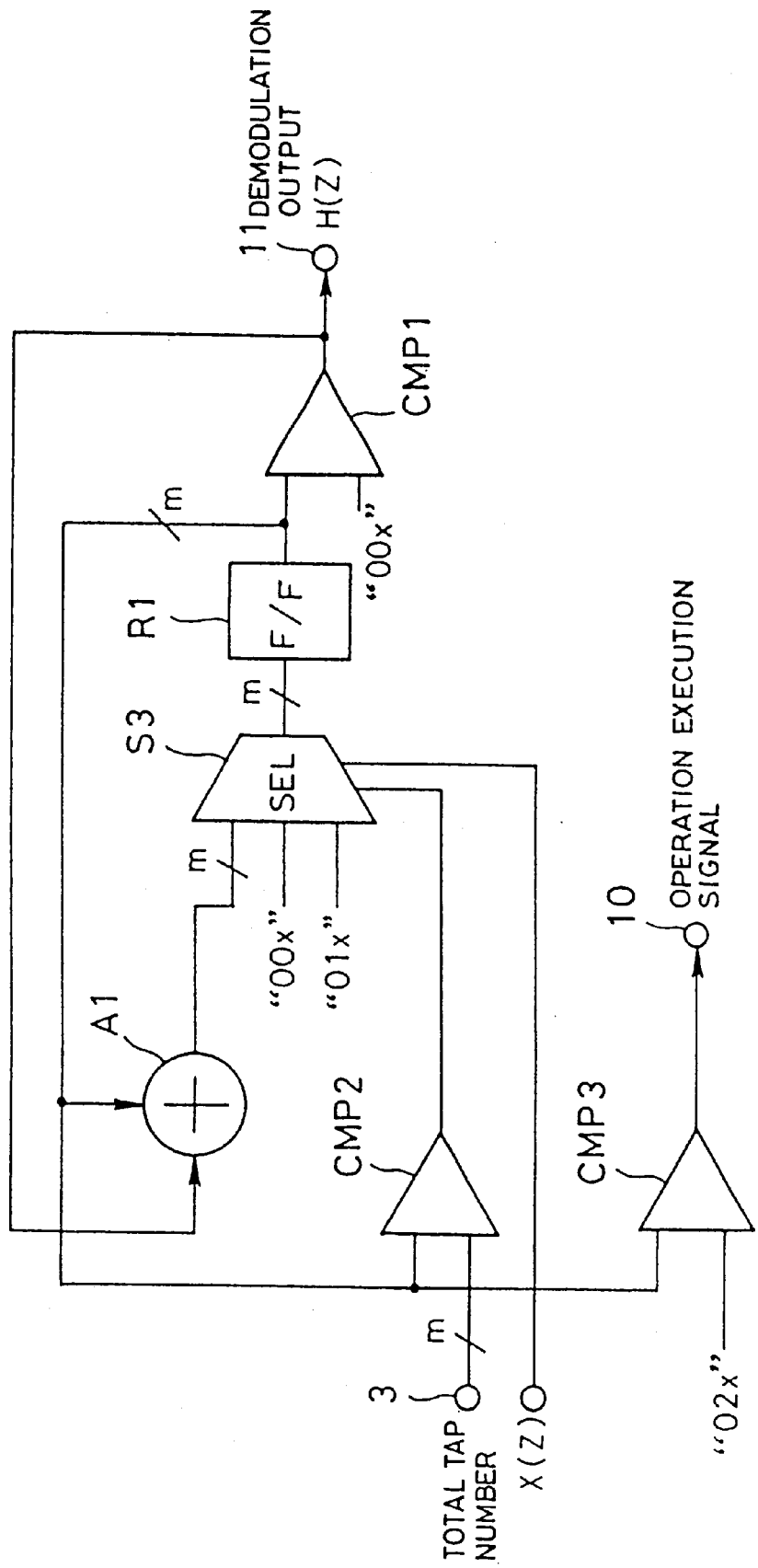
FIG. 10 is a circuit diagram showing a still further example of the LPF.

FIG. 10 is a circuit diagram showing the third embodiment of the LPF 9. Like elements to those in FIGS. 7 and 9 will be identified by like reference numerals. In the shown embodiment, two selection circuits S1 and S2 in the former embodiment of FIG. 7 are combined into one three-input selection circuit S3. As a selection control signal, the input signal X(Z) and the output of the second comparator circuit CMP2 are employed. Other constructions are equivalent to those in the embodiment of FIG. 7 and thus detailed discussion for such common elements would be neglected for avoiding redundant discussion and whereby for keeping the disclosure simple enough to facilitate clear understanding of the present invention.

In FIG. 10, the selection circuit S3 selects the first fixed value when the input X(z) is "H", selects the second fixed value when the comparison result from the second comparator circuit CMP2 is "H", and outputs the output of the m-bit adder circuit A1. otherwise. The circuit construction shown in FIG. 10 is intended to reduce the number of the selection circuit of the LPF shown in FIG. 7 and is equivalent to the circuit operation as that of the circuit in FIG. 7.

Figure 11:
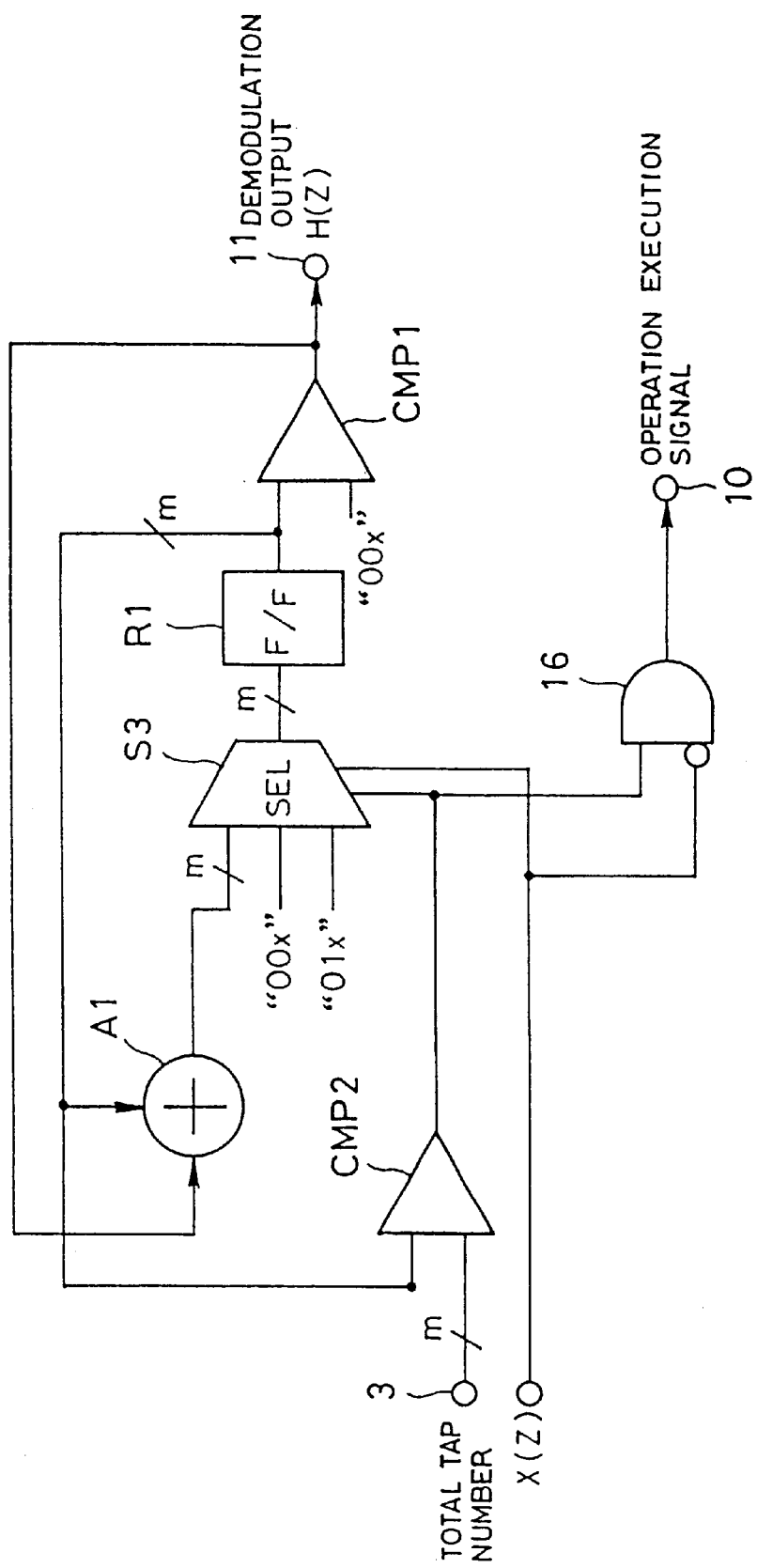
FIG. 11 is a circuit diagram showing a yet further example of the LPF.

FIG. 11 is a circuit diagram showing the fourth embodiment of the LPF 9. Like elements to those in FIGS. 7, 9 and 10 will be identified by like reference numerals. In the shown embodiment, two selection circuits S1 and S2 in the former embodiment of FIG. 9 are combined into one three-input selection circuit S3. As a selection control signal, the input signal X(Z) and the output of the second comparator circuit CMP2 are employed. Other constructions are equivalent to those in the embodiment of FIG. 7 and thus detailed discussion for such common elements would be neglected for avoiding redundant discussion and whereby for keeping the disclosure simple enough to facilitate clear understanding of the present invention.

Figure 12:
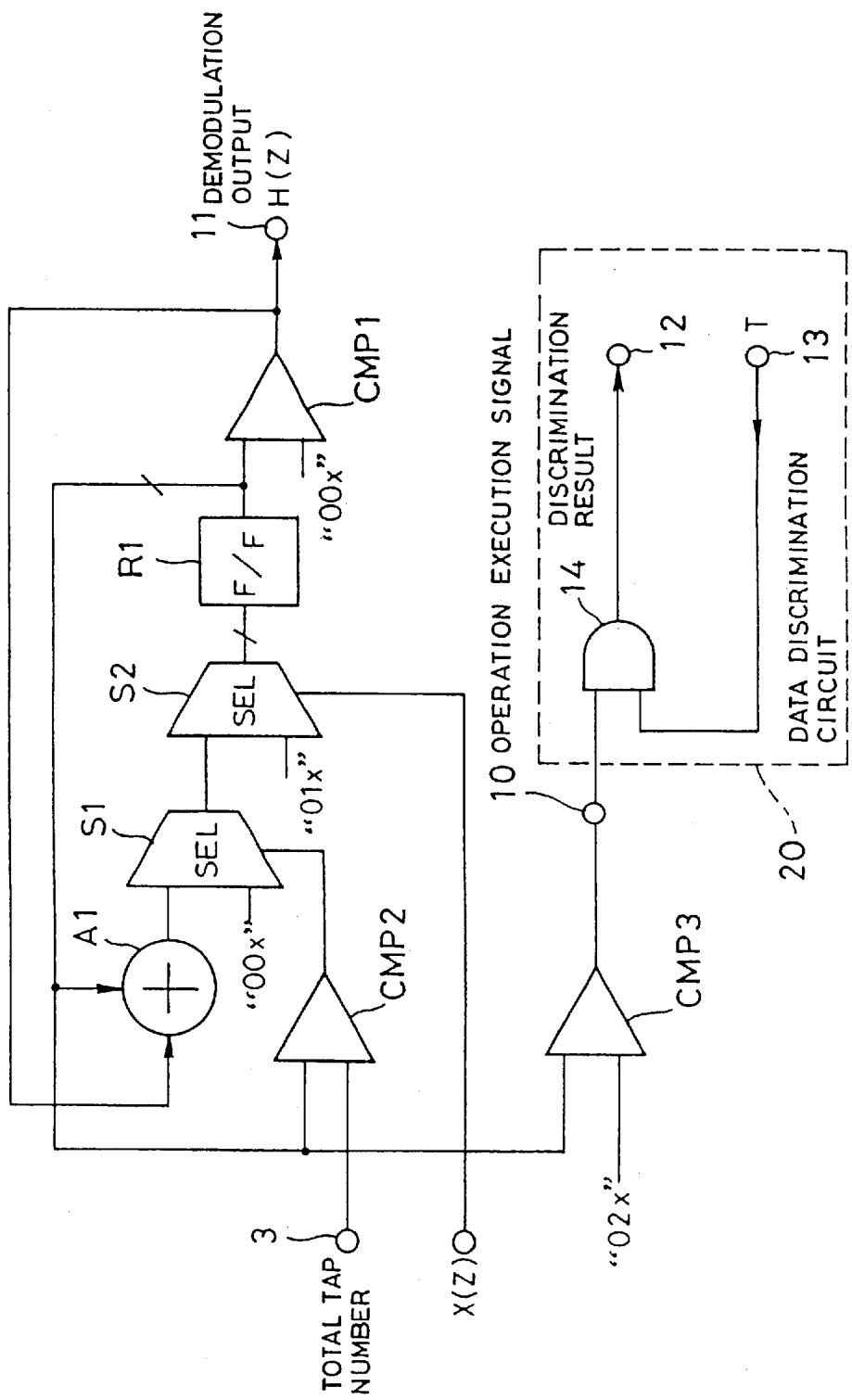
FIG. 12 is a circuit diagram showing the first embodiment of the demodulation circuit according to the present invention.

FIG. 12 is a circuit diagram showing the first embodiment of the demodulation circuit according to the present invention. In the shown embodiment, the circuit shown in FIG. 7 is used as the LPF. The data discrimination circuit 20 includes a two-input AND circuit 14 taking the operation execution signal 10 generated and output from the LPF 9 and an input signal T from a reference time input terminal 13, and a judgment result output terminal 12 connected to the output of the AND circuit 14.

In FIG. 12, during the tap calculation execution period, "H" is output from the third comparator circuit CMP 3, and accordingly, "H" pulse is input from the reference timing input terminal T during the tap calculation execution period. Then, "H" is output from the judgment result output terminal 12. A timing for inputting the "H" pulse from the reference timing input terminal T is after a period t from the rising of the demodulation output in the timing chart shown in FIG. 5.

Figure 13:
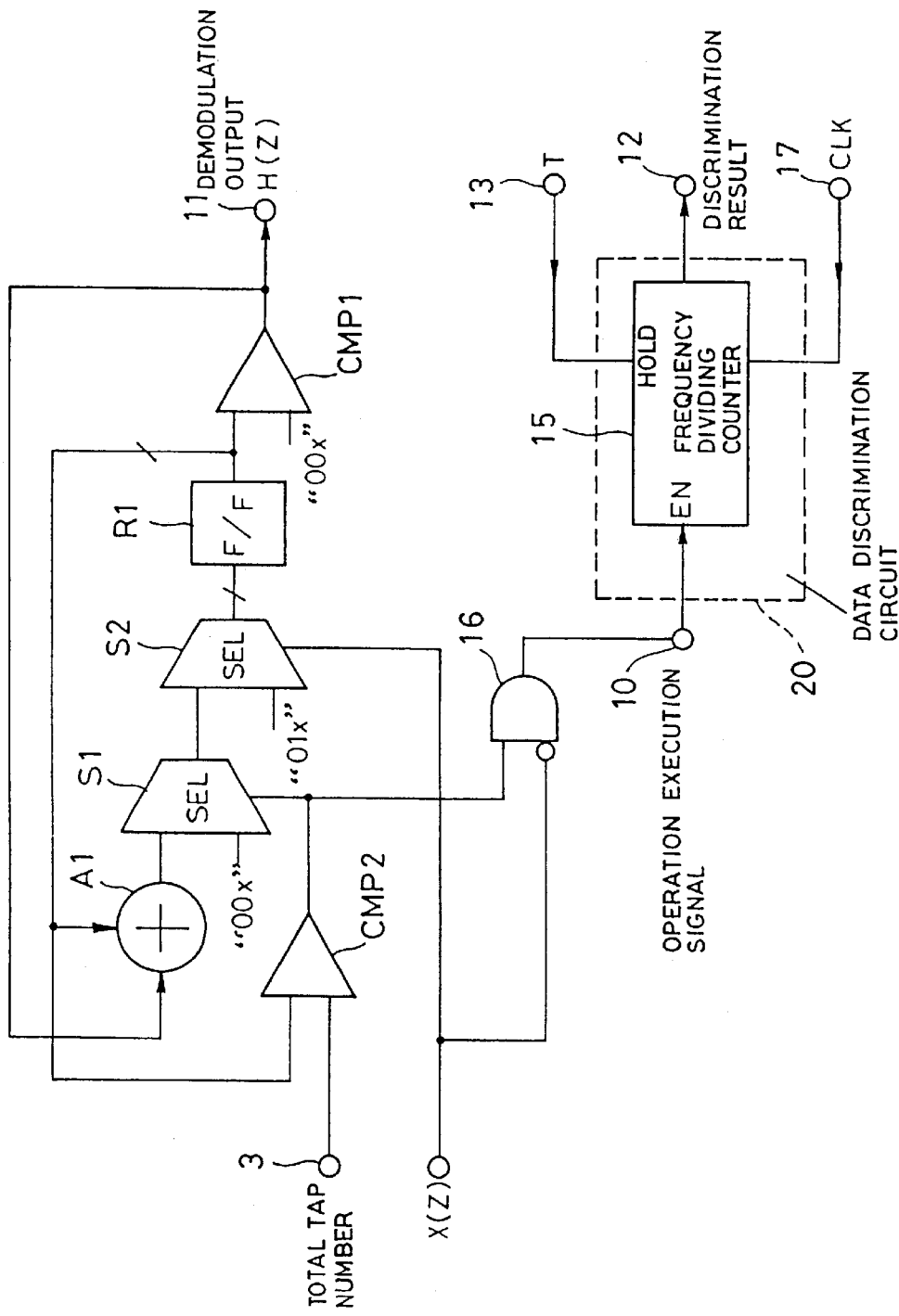
FIG. 13 is a circuit diagram showing the second embodiment of the demodulation circuit according to the present invention.

FIG. 13 is a circuit diagram showing the second embodiment of the demodulation circuit according to the present invention. In the shown embodiment, the circuit shown in FIG. 9 is used as the LPF. The data discrimination circuit 20 includes a frequency dividing counter 15 having a count permission signal input terminal EN connected to the operation execution signal 10 generated from the LPF 9 and a holding input connected to the reference timing input terminal 13 for inputting the input signal T, and a judgment result output terminal 12, to which the output of the frequency dividing counter 15 is connected.

In FIG. 13, as the output (operation execution signal) 10 of the AND circuit 16, "H" is output during a period while tap calculation is performed. In the frequency dividing counter 15, counting of a high speed clock CLK from the clock input terminal 17 is executed during a period while the output from the AND circuit 16 is "H". From the frequency dividing counter 15, a particular bit or a signal derived by decoding the result of frequency division in the frequency dividing counter 15 is output as the result of judgment. In the frequency dividing counter 15, when the "H" pulse signal T is input from the reference timing input terminal 13, the result of counting up to that timing is held as the judgment result to output through the output terminal 12. A timing to input the "H" pulse signal from the reference timing input terminal 13 is a timing after a period t from rising of the demodulation output in the timing chart shown in FIG. 4.

Combination of the data discrimination circuit 20 in the circuit constructions in respective embodiments shown in FIGS. 12 and 13 and respective LPF shown in FIGS. 7 and 9 to 11 should not be taken limitative but can take any possible combinations.

It should be noted that while the present invention is premised to exclusively input the infrared data and the serial data in a time division basis, it is possible to perform the exclusive process in the circuit construction. For example, employing the result of judgment by the demodulation circuit in accordance with the present invention, the infrared input terminal and the serial input terminal can be controlled exclusively. Such circuit construction can be easily realized technically, and may not require detailed description, particularly.

The pulse signal T from the reference timing input terminal 13 in the circuit construction in respective embodiments shown in FIGS. 12 and 13 is a signal input at the timing of discrimination between the infrared data and the serial data from the leading end of the reception packet, and can be generated as follow, for example. In FIG. 1, a stand-by state detecting circuit making judgment of a no-signal period where signal is input at neither of the infrared input terminal 1 and the serial input terminal 2, is provided. A timing after a given period from occurrence of transition from the no-signal period detected by the stand-by state detection circuit to a signal input period, is taken as the reference timing t. Naturally, the reference timing can be input externally.

Figure 2:
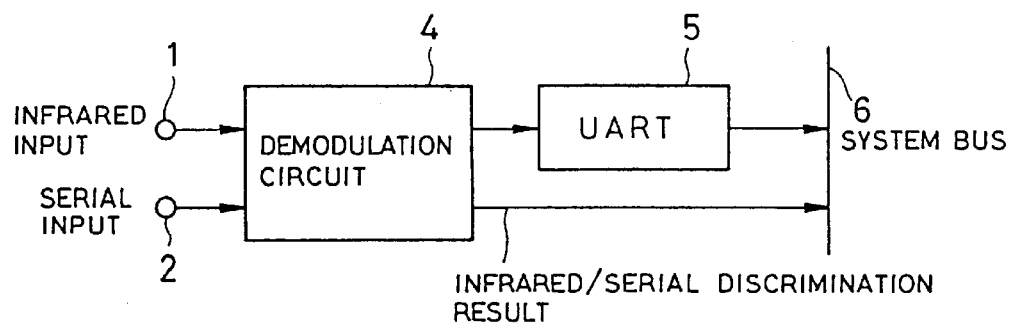
FIG. 2 is a block diagram showing an example of application of the demodulation circuit according to the present invention.
Figure 14:
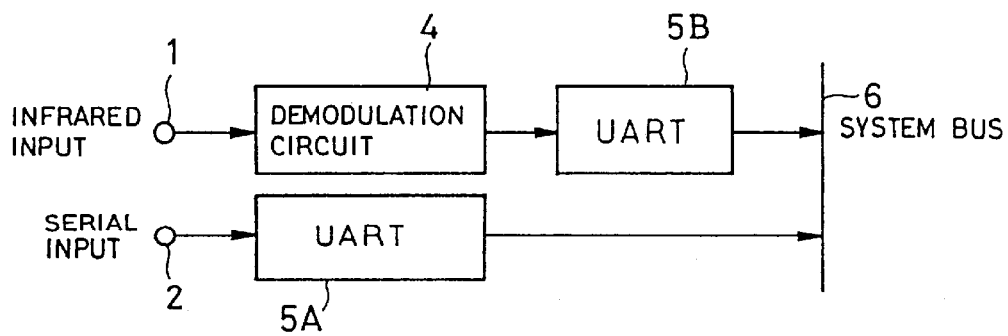
FIG. 14 is a circuit diagram showing an example of application of the conventional demodulation circuit.
Figure 15:
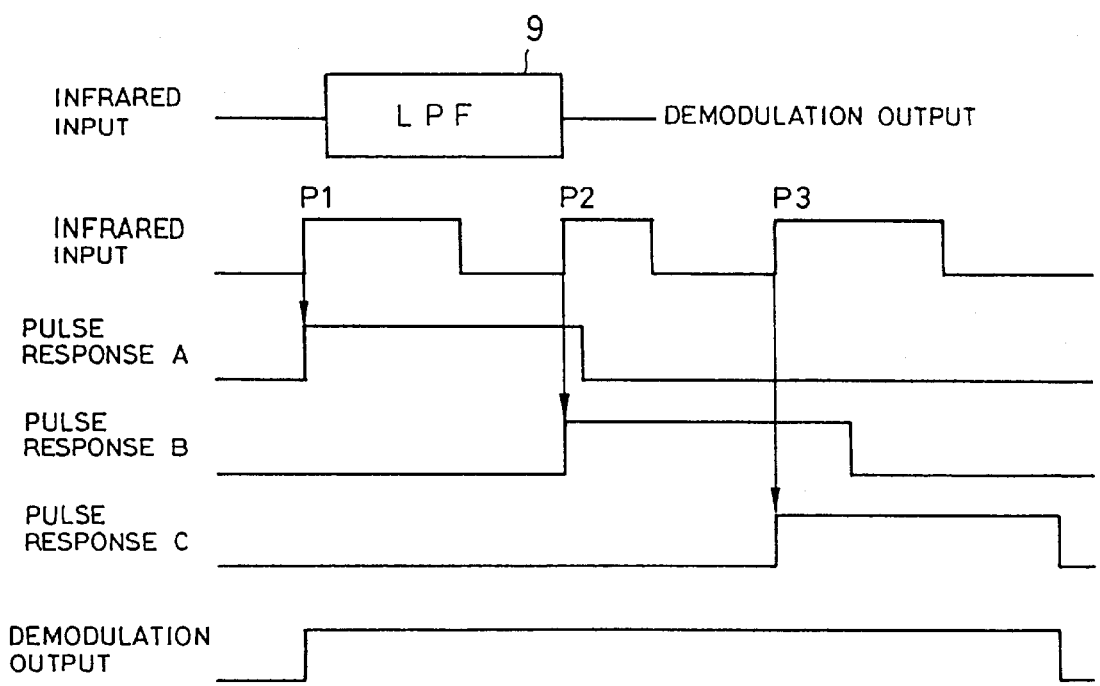
FIG. 15 is a circuit diagram and a operational waveform chart of the prior art.
Figure 16:
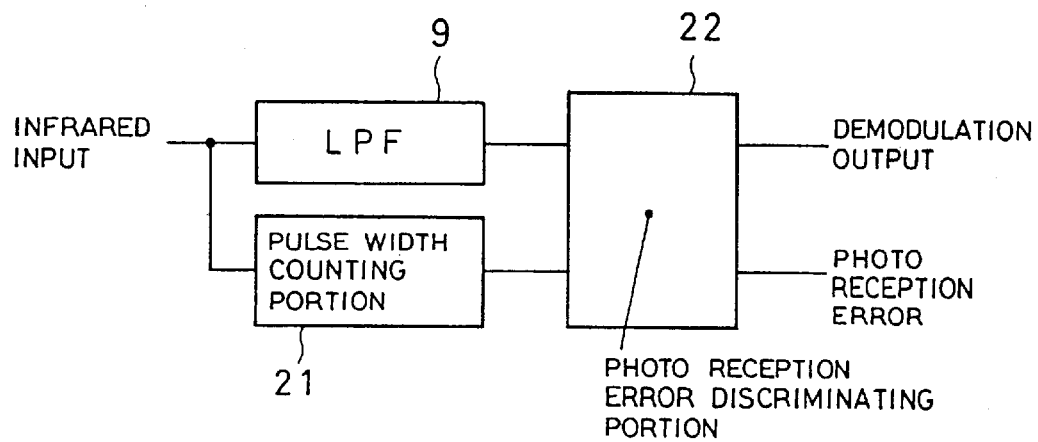
FIG. 16 is a circuit diagram showing the prior art.
Figure 17:
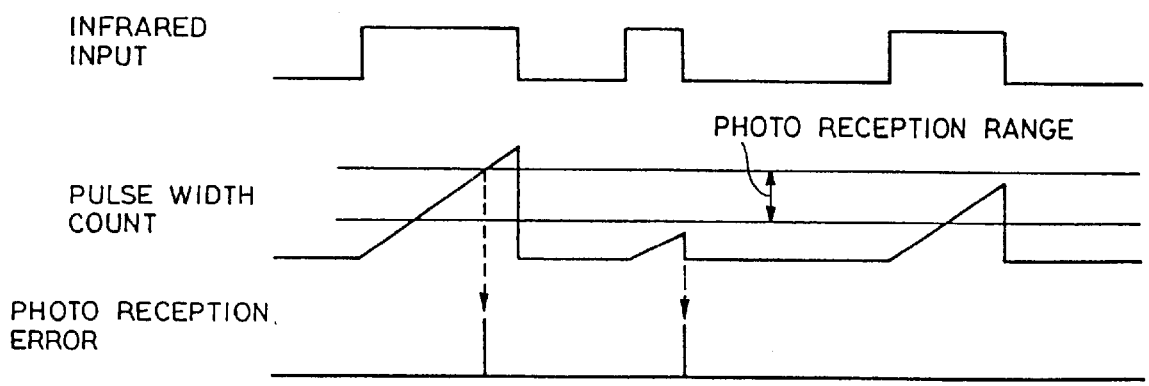
FIG. 17 is an illustration showing operation of the circuit of FIG. 16.
Figure 18:
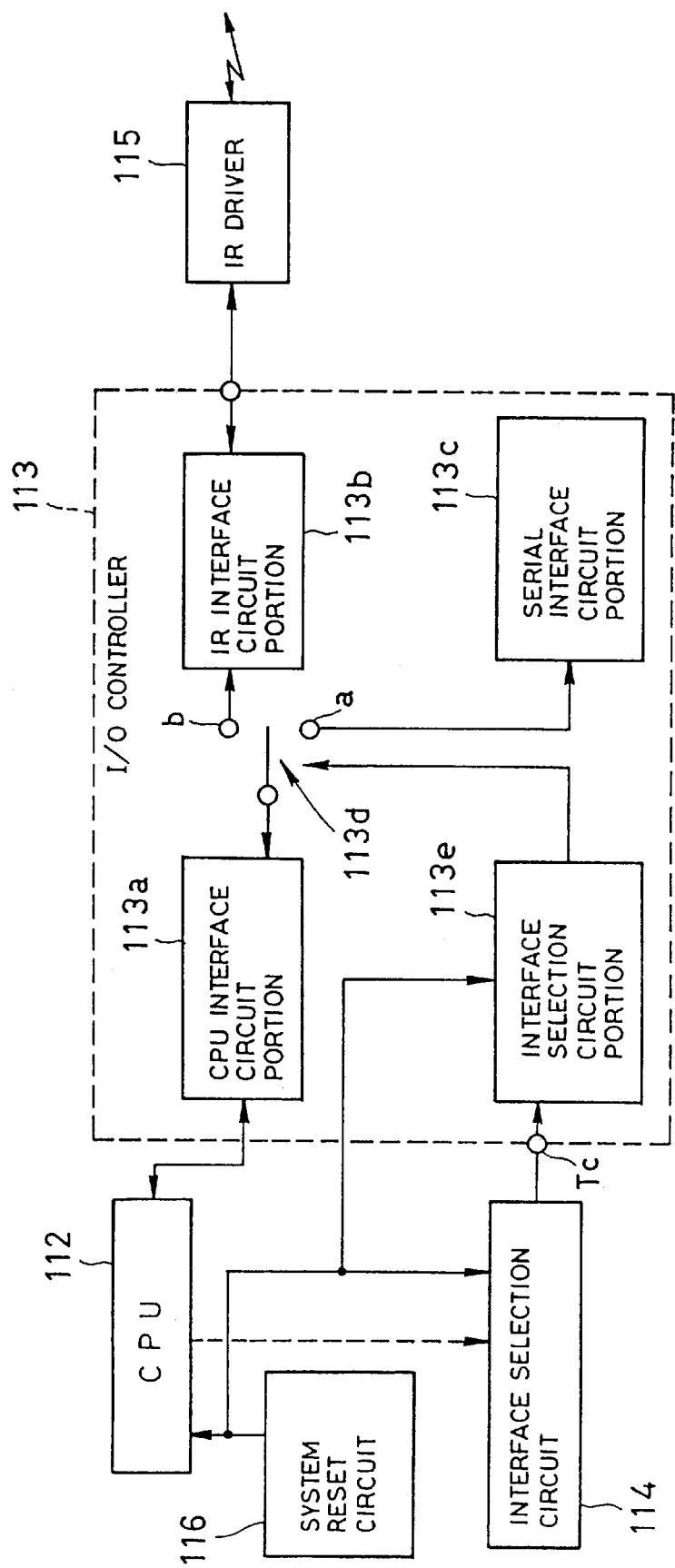
FIG. 18 is a circuit diagram showing the prior art.

An example of application of the demodulation circuit according to the present invention is illustrated in FIG. 2. Namely, the infrared input 1 is connected to the system bus 6 via the UART 5 after demodulation in the demodulation circuit 4. The serial input 2 is also connected to the input of the demodulation circuit 4 in the similar manner. The demodulation output from the demodulation circuit 4 is connected to the system bus 6 via the UART 5. On the other hand, a result of discrimination between the serial data and the infrared data output from the demodulation circuit 4 is also connected to the system bus 6. Comparing with the construction in the prior art shown in FIG. 14, it should be appreciated that number of UARTs to be used can be reduced.

As can be appreciated, conventionally, two UARTs for reproducing the infrared data and the serial data is required, whereas the present invention can be realized with single UART. Also, in the conventional demodulation circuit, it has not been possible to discriminate the reception signal between the serial data and the infrared data by a single demodulation circuit, whereas the present invention can so discriminate. Accordingly, for example, by automatically modifying the sampling clock by the UART on the basis of the result of discrimination by the demodulation circuit, both of the infrared data and the serial data can perform serial/parallel conversion for outputting the demodulated output by the UART. Accordingly, the user is not required to pay attention as to whether the reception data is the infrared data or the serial data. It should be noted that the serial data has quite a large pulse width as compared with the infrared data, as shown in FIG. 3. Accordingly, even when the pulse width is expanded slightly by the demodulation circuit, no problem will be encountered in the sense of data. On the other hand, since demodulation can be performed using the rising up of the infrared data, demodulation can be performed even when the pulse width of the infrared data is unstable. Therefore, it becomes possible to use a device having low response characteristics, as the photo reception element in the input portion.

As set forth above, according to the present invention, the number of the UARTs to be used can be reduced to contribute for down-sizing of the circuit scale and lowering of cost. Particularly, by using the circuit construction constituted of the selection circuit, the flip-flop, the comparator circuit and the adder circuit as one-bit LPF for demodulation in place of the FIR digital filter, the circuit scale can be made smaller irrespective of the total number of taps, and is suitable for integration.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

For instance, the demodulation circuit according to the present invention may employ a low pass filter disclosed in the commonly owned co-pending U.S. Patent Application, entitled "Low Pass Filter" and filed with claiming priority based on Japanese Patent Applications No. Heisei 10-327394 and No. Heisei 10-327396 both filed on Nov. 18, 1998. The disclosure of the above-identified commonly owned co-pending application is herein incorporated by reference.

What is claimed is:

1. A demodulation circuit for inclusively receiving an infrared data and a serial data and outputting a decoded signal, comprising:

edge detecting means for detecting an edge of said infrared data and outputting an edge detection signal;

OR means for deriving OR of said edge detection signal and said serial data;

low-pass filter means for initiating a filter operation in response to an output of said OR means and outputting an operation execution signal indicative of a filter operation period preliminarily determined by a total tap number signal and a demodulation signal as a process output of said filter means; and data discrimination means for discriminating between demodulation of said infrared data and demodulation of said serial data depending upon said operation execution signal and outputting a discrimination result signal.

2. A demodulation circuit as set forth in claim 1, wherein said operation execution signal is a pulse from completion of inputting of an input signal of said low-pass filter means to completion of said filter operation.

3. A demodulation circuit as set forth in claim 1, wherein said data discrimination means compares a number of times of tap calculation of said filter means executed during a predetermined period from initiation of outputting of a demodulated signal from said low-pass filter means and a preliminarily set number of times to output the discrimination result signal depending upon a result of comparison.

4. A demodulation circuit as set forth in claim 1, wherein said low-pass filter means comprises:

a first m-bit selection means taking a first fixed value as one input and controlled by an output signal of said OR means, wherein m is an integer greater than or equal to two;

an m-bit flip-flop taking an output of said first m-bit selection means as an input;

a first comparator circuit for comparing an output of said m-bit flip-flop and a second fixed value;

an m-bit adder circuit adding an output of said first comparator circuit to a least significant bit of data output of said m-bit flip-flop;

a second comparator circuit comparing the data output of said m-bit flip-flop and a total tap number of the filter means;

a second m-bit selection means taking an output of said m-bit adder circuit and a third fixed value as inputs, controlled by an output of said second comparator circuit and outputting to another input of said first m-bit selection means; and third comparator circuit comparing the output of said m-bit flip-flop and an arbitrary fixed value, an output signal of said third comparator circuit being output as said operation execution signal, said output signal of said first comparator circuit being output from a demodulation output terminal.

5. A demodulation circuit as set forth in claim 1, wherein said low-pass filter means comprises:

a first m-bit selection means taking a first fixed value as one input and controlled by an output signal of said OR means, wherein m is an integer greater than or equal to two;

an m-bit flip-flop taking an output of said first m-bit selection means as data input;

a first comparator circuit for comparing a data output of said m-bit flip-flop and a second fixed value;

an m-bit adder circuit adding an output of said first comparator circuit to a least significant bit of data output of said m-bit flip-flop;

a second comparator circuit comparing the data output of said m-bit flip-flop and a total tap number of the filter means;

a second m-bit selection means taking an output of said m-bit adder and a third fixed value as inputs, controlled by an output of said second comparator circuit and outputting to another input of said first m-bit selection means; and an AND circuit deriving an AND of the output of said second comparator circuit and an inverted output of said OR means, an output signal of said AND circuit being output as said operation execution signal and an output signal of said first comparator circuit being output through a demodulation output terminal.

6. A demodulation circuit as set forth in claim 1, wherein said low-pass filer means comprises:

an m-bit selection means having three inputs and taking first and second fixed values as inputs;

an m-bit flip-flop taking an output of said m-bit selection means as data input;

a first comparator circuit for comparing a data output of said m-bit flip-flop and a third fixed value;

an m-bit adder circuit adding an output of said first comparator circuit to a least significant bit of data output of said m-bit flip-flop;

a second comparator circuit comparing the data output of said m-bit flip-flop and a total tap number of the filter means; and a third comparator circuit taking the output of said m-bit flip-flop and said arbitrary fixed value as inputs, said m-bit selection means being controlled by said output of said or means and the output of said second comparator circuit to output an output signal of said third comparator circuit as said operation execution signal, and an output of said first comparator circuit being output from a demodulation output terminal.

7. A demodulation circuit as set forth in claim 1, wherein said low-pass filer comprises:

an m-bit selection means having three inputs and taking first and second fixed values as inputs;

an m-bit flip-flop taking an output of said m-bit selection means as data input;

a first comparator circuit for comparing a data output of said m-bit flip-flop and a third fixed value;

an m-bit adder circuit adding an output of said first comparator circuit to a least significant bit of data output of said m-bit flip-flop;

a second comparator circuit comparing the data output of said m-bit flip-flop and a total tap number of the filter means; and an AND circuit deriving an AND of the output of said second comparator circuit and an inverted output of said OR means, said m-bit selection circuit being controlled by the output of said OR means and the output of said second comparator circuit, the output of said AND circuit being output as said operation execution signal, and the output signal of said first comparator circuit being output through a demodulation output terminal.

8. A demodulation circuit as set forth in claim 4, wherein a least significant bit of said first fixed value is set "1", all bits of said first fixed value other than said least significant bit are set "0", all bits of said second and third fixed values are set "0", and said arbitrary fixed value is set greater than or equal to "2", and m is set at a value derived by rounding a logarithm of 2 of total tap number into an integer.

9. A demodulation circuit as set forth in claim 1, wherein said data discrimination means comprises an AND circuit taking said operation execution signal and a reference timing signal externally input at a preliminarily set reference timing, and an output signal of said AND circuit is output as said discrimination result signal.

10. A demodulation circuit as set forth in claim 1, wherein said data discrimination means is supplied with a reference timing signal externally input at a preliminarily set reference timing to a holding terminal and is supplied said operation execution signal to an enabling terminal, and has a counter for counting a predetermined clock signal, for outputting an output signal of said counter as said discrimination result signal.

\* \* \* \* \*